(12) United States Patent
Park et al.

(10) Patent No.: US 9,276,175 B2
(45) Date of Patent: Mar. 1, 2016

(54) LIGHT EMITTING DEVICE, LIGHT EMITTING DEVICE PACKAGE

(75) Inventors: Hyung Jo Park, Seoul (KR); Sun Kyung Kim, Seoul (KR); Woon Kyung Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 209 days.

(21) Appl. No.: 12/979,673

(22) Filed: Dec. 28, 2010

(65) Prior Publication Data

US 2011/0156073 A1 Jun. 30, 2011

(30) Foreign Application Priority Data

Dec. 29, 2009 (KR) ........................ 10-2009-0132394

(51) Int. Cl.
*H01L 33/00* (2010.01)
*H01L 33/44* (2010.01)

(52) U.S. Cl.
CPC ....... *H01L 33/44* (2013.01); *H01L 2224/48091* (2013.01); *H01L 2924/12032* (2013.01)

(58) Field of Classification Search
USPC ......... 257/79, 98, E33.011, E33.06, E33.061, 257/E33.067, E33068, E33.069, E33.072, 257/E33.073; 428/29, 31, 30, 69, 74, 428/FOR. 415, FOR. 416; 372/46.01, 372/46.014, 45.01, 49.01, 50.11, 64, 103, 372/107; 359/298, 299, 308, 359, 588; 362/610, 12, 555, 583, 560
See application file for complete search history.

(56) References Cited

U.S. PATENT DOCUMENTS

| | | | |
|---|---|---|---|
| 4,501,470 A * | 2/1985 | Yeh | 359/887 |
| 6,864,935 B2 | 3/2005 | Kim et al. | |
| 7,944,957 B2 | 5/2011 | Suzuki et al. | |
| 8,183,584 B2 | 5/2012 | Wang et al. | |
| 2008/0128727 A1 | 6/2008 | Erchak et al. | |
| 2008/0191608 A1 | 8/2008 | Schmidt | |
| 2008/0279229 A1* | 11/2008 | Suzuki et al. | 372/19 |
| 2009/0236619 A1* | 9/2009 | Chakroborty | 257/89 |
| 2010/0244075 A1 | 9/2010 | Knapp | |
| 2011/0062467 A1 | 3/2011 | Song | |
| 2011/0168971 A1 | 7/2011 | Song | |

FOREIGN PATENT DOCUMENTS

| | | |
|---|---|---|
| EP | 0 563 991 A2 | 10/1993 |
| JP | 1-160063 A | 6/1989 |
| JP | 5-283735 A | 10/1993 |
| JP | 8-236807 A | 9/1996 |
| JP | 09-237916 | 9/1997 |
| JP | 2004-031843 A | 1/2004 |
| JP | 2007-335731 A | 12/2007 |
| JP | 2008-538652 A | 10/2008 |
| JP | 2008-270707 A | 11/2008 |
| JP | 2008-283028 A | 11/2008 |
| TW | 200507297 A | 2/2005 |
| TW | 200805698 A | 1/2008 |
| WO | 2009/075880 A2 | 6/2009 |
| WO | 2009/120011 A2 | 10/2009 |
| WO | 2009/145465 A2 | 12/2009 |

OTHER PUBLICATIONS

F. A. Jenkins: "Fundamentals of Optics", 2001, McGraw-Hill Primis, XP002719523, ISBN: 0072561912, p. 290, 311-312.

\* cited by examiner

*Primary Examiner* — Meiya Li
(74) *Attorney, Agent, or Firm* — Dentons US LLP

(57) ABSTRACT

Provided are a light emitting device, a light emitting device package, and a lighting system. The light emitting device includes a light emitting structure, a buffer layer on the light emitting structure, and a filter layer on the buffer layer.

16 Claims, 8 Drawing Sheets

LIGHT EMITTING DEVICE, LIGHT EMITTING DEVICE PACKAGE

CROSS-REFERENCE TO RELATED APPLICATIONS

The present application claims priority under 35 U.S.C. §119(a) of Korean Patent Application No. 10-2009-0132394 filed on Dec. 29, 2009, which is hereby incorporated by reference in its entirety.

BACKGROUND

Embodiments relate to a light emitting device, a light emitting device package, and a lighting system.

In light emitting devices, P-N junction diodes having the properties of converting electrical energy into light energy may be formed by combining group III and V elements on the periodic table. Light emitting devices may implement various colors by controlling the composition ratio of compound semiconductors.

In light emitting devices, when a forward voltage is applied, an electron of an n-layer is combined with a hole of a p-layer to emit energy corresponding to an energy gap between the conduction band and the valance band. The energy is generally emitted in the form of heat or light. In light emitting devices, the energy is emitted in the form of light.

Nitride semiconductors, for example, are attracting much attention for the fields of optical devices and high-power electronic devices because of their high thermal stability and wide band gap energy. In particular, blue light emitting devices, green light emitting devices, and UV light emitting devices that use nitride semiconductors have been commercialized and are widely used.

A white LED module in the related art may be formed by combining separate light sources of R, G, and B or by combining a phosphor and a blue or ultra violet light source.

In a typical phosphor conversion method using a yellow phosphor applied to the outside of a blue LED, light converted at the phosphor is naturally emitted, and thus, the light is emitted forward. At this point, light may be incident again into a light emitting device and be absorbed in the device to cause an optical loss and degrade light emitting efficiency.

SUMMARY

Embodiments provide a light emitting device, a light emitting device package, and a lighting system, which can obtain an effective color rendering index.

In one embodiment, a light emitting device includes a light emitting structure, a buffer layer on the light emitting structure, and a filter layer on the buffer layer.

In another embodiment, a light emitting device includes: a light emitting structure including a first conductive type semiconductor layer, a second conductive type semiconductor layer, and an active layer between the first conductive type semiconductor layer and the second conductive type semiconductor layer; a buffer layer on the light emitting structure; a filter layer on the buffer layer; an electrode on the light emitting structure; and a conductive or non-conductive substrate under the light emitting structure.

In further another embodiment, a light emitting device includes: a light emitting structure including a first conductive type semiconductor layer, a second conductive type semiconductor layer, and an active layer between the first conductive type semiconductor layer and the second conductive type semiconductor layer; a buffer layer on the light emitting structure; and a filter layer on the buffer layer, wherein the filter layer includes: a first dielectric layer having a first refractive index; and a second dielectric layer on the first dielectric layer, the second dielectric layer having a second refractive index different from the first refractive index.

In further another embodiment, a light emitting device package includes: a package body; at least one electrode layer on the package body; and the light emitting device electrically connected to the electrode layer.

In further another embodiment, a lighting system includes a board, and a light emitting module including a light emitting device package on the board, wherein the light emitting device package includes: a package body; a third electrode layer and a fourth electrode layer on the package body; and the light emitting device electrically connected to the third and fourth electrode layers.

The details of one or more embodiments are set forth in the accompanying drawings and the description below. Other features will be apparent from the description and drawings, and from the claims.

BRIEF DESCRIPTION OF THE DRAWINGS

FIGS. 6 to 10A are schematic views illustrating a method of manufacturing a light emitting device according to the first embodiment.

DETAILED DESCRIPTION OF THE EMBODIMENTS

Hereinafter, a light emitting device, a light emitting device package, and a lighting system according to embodiments will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

<Embodiments>

Figure 1:
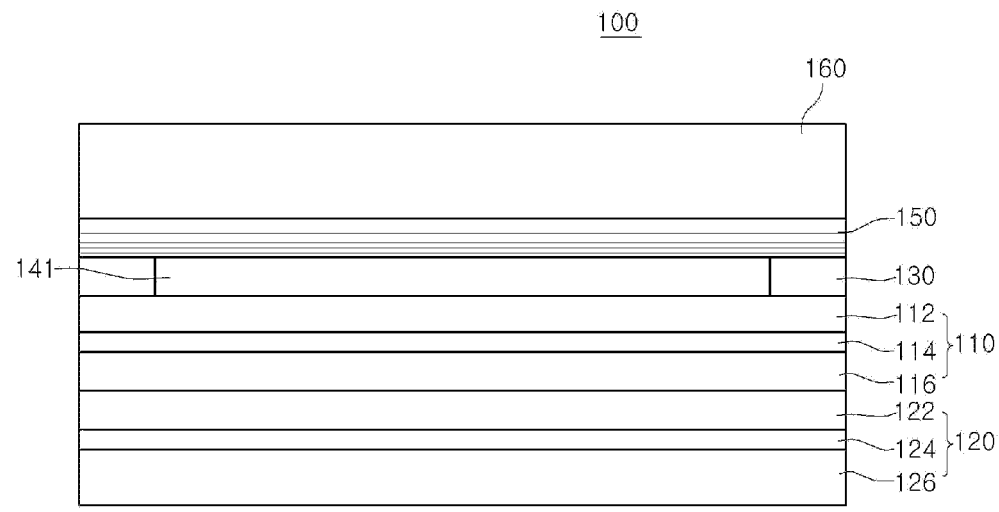
FIG. 1 is a cross-sectional view illustrating a light emitting device according to a first embodiment.

FIG. 1 is a cross-sectional view illustrating a light emitting device 100 according to a first embodiment.

The light emitting device 100 may include a light emitting structure 110, a buffer layer 141 disposed on the light emitting structure 110, and a filter layer 150 disposed on the buffer layer 141.

In the first embodiment, the buffer layer 141 may include an air gap or a hollow space part, and a support layer 130 may be disposed between the filter layer 150 and the light emitting structure 110.

The filter layer 150 may include a first dielectric layer 151 having a first refractive index, and a second dielectric layer 152 having a second refractive index different form the first refractive index and disposed on the first dielectric layer 151.

The thickness of the first dielectric layer 151 and the thickness of the second dielectric layer 152 may be $\lambda/(4n \times \cos\theta)$ (where, $\lambda$ is a wavelength of long wavelength light to be reflected, n is a refractive index of a dielectric layer, and $\theta$ is an incident angle of light to a substrate).

A phosphor layer 160 may be disposed on the filter layer 150 in the current embodiment, but the present disclosure is not limited thereto.

FIGS. 2 to 5 are graphs illustrating characteristics of a light emitting device according to an embodiment.

Figure 2:
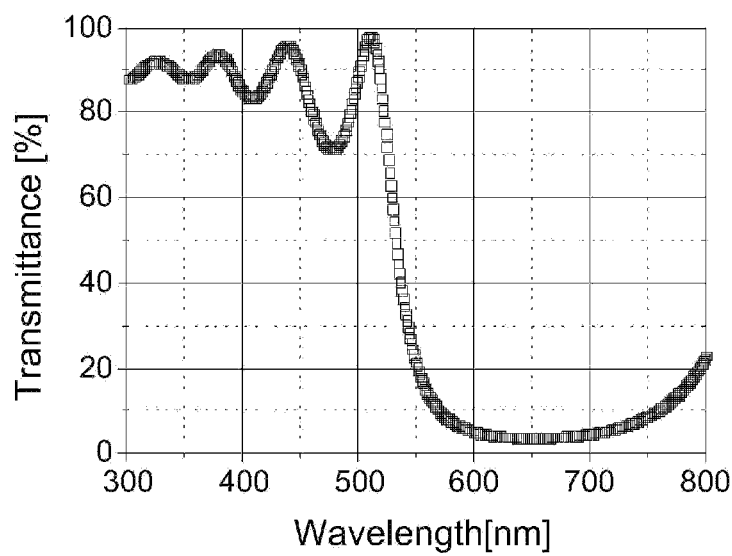
FIGS. 2 to 5 are graphs illustrating characteristics of a light emitting device according to an embodiment.
Figure 3:
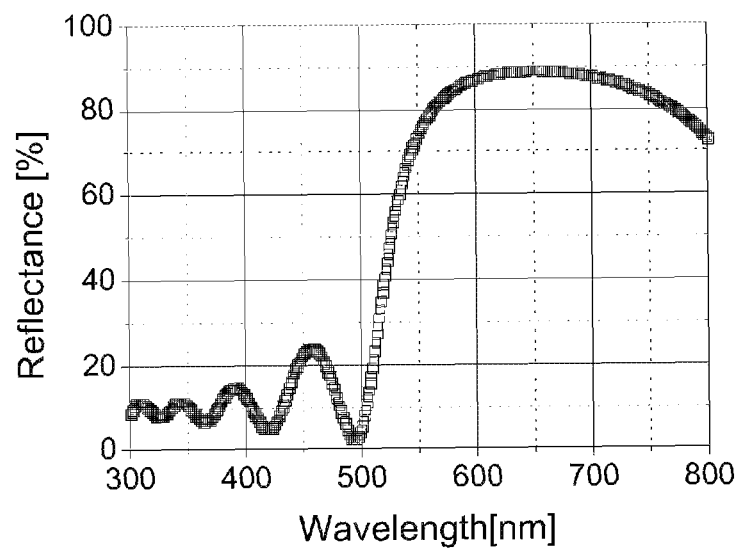

In detail, FIG. 2 is a graph illustrating a transmittance according to a wavelength from the inside of a light emitting device to the outside thereof according to an embodiment, and FIG. 3 is a graph illustrating a reflectance according to a wavelength from the outside of a light emitting device to the inside thereof according to an embodiment.

According to an embodiment, the filter layer 150 disposed between a light emitting device and a phosphor layer is a stacked structure of a material having a low refractive index and a material having a high refractive index to transmit short wavelength light traveling from the inside of the light emitting device to the outside thereof (refer to FIG. 2) and reflect long wavelength light converted through the phosphor layer, thereby preventing the long wavelength light from being incident into the light emitting device (refer to FIG. 3).

According to the embodiment, air or a material having a refractive index similar to that of air may be injected between the filter layer 150 and the light emitting device to form an efficient buffer layer. Thus, while short-wavelength light emitted from the light emitting device is efficiently extracted through filtering, the reflectance of long-wavelength light converted through the phosphor can be more efficiently increased through an inner total refraction from a high refractive index to a lower refractive index.

Figure 4:
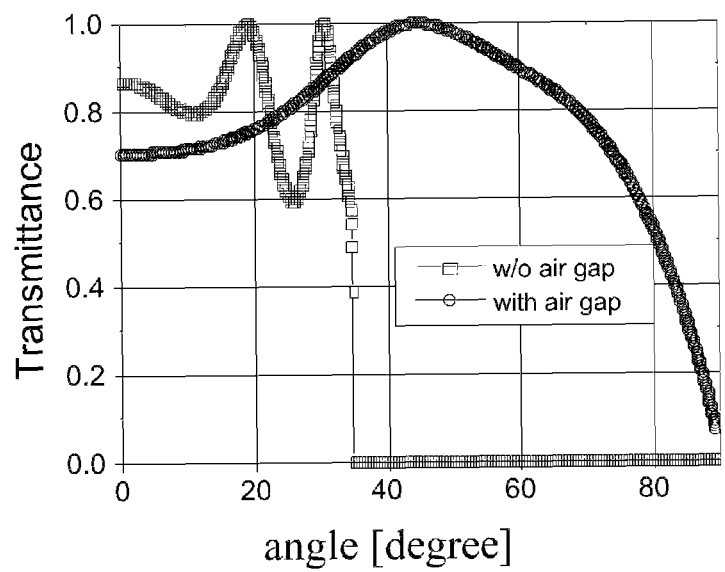

For example, FIG. 4 is a graph illustrating a transmittance of short-wavelength light generated from a light emitting device according to the presence or absence of an air gap, according to an embodiment. As illustrated in FIG. 4, the transmittance of light increases entirely in a region with an air gap and an incident angle of about 30° or greater.

Figure 5:
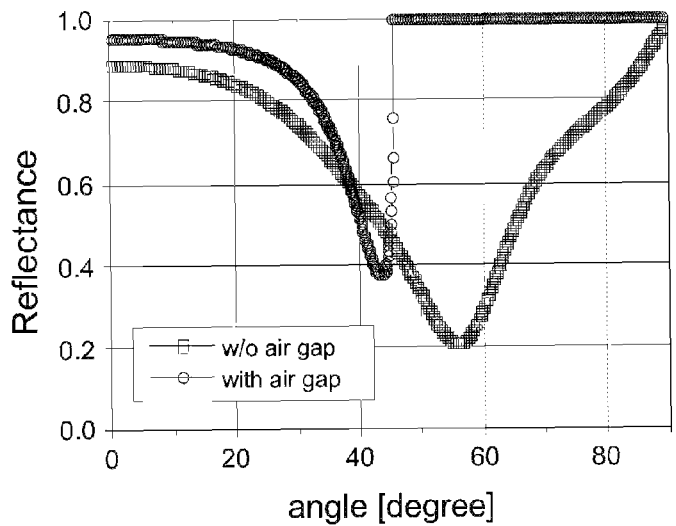

Specifically, FIG. 5 is a graph illustrating a reflectance of long-wavelength light generated from an outer phosphor of a light emitting device according to the presence or absence of an air gap, according to an embodiment. Here, the reflectance of light increases in the rest except for a region with an air gap and an incident angle slightly greater than about 40°.

A light emitting device according to an embodiment includes a selective filter layer between the light emitting device and a phosphor layer to transmit high-energy light such as a blue visibly ray or an ultra violet ray and reflect low-energy light excited through a phosphor, thereby obtaining an effective color rendering index.

Hereinafter, a method of manufacturing a light emitting device according to the first embodiment will be described with reference to FIGS. 6 to 10A.

Figure 6:
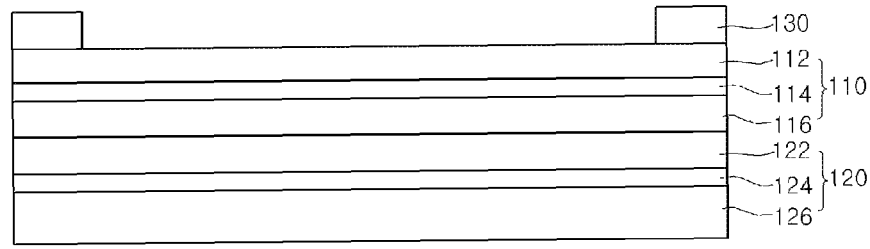

First, as illustrated in FIG. 6, the light emitting structure 110 including a first conductive type semiconductor layer 112, an active layer 114, and a second conductive type semiconductor layer 116 may be formed.

The first conductive type semiconductor layer 112 may be formed of group III-V compound semiconductor doped with a first conductive type dopant. When the first conductive type semiconductor layer 112 is an N-type semiconductor layer, the first conductive type dopant may include Si, Ge, Sn, Se, or Te as an N-type dopant, but the present disclosure is not limited thereto.

The first conductive type semiconductor layer 112 may include a semiconductor material having a compositional formula of $In_xAl_yGa_{1-x-y}N$ ($0 \leq x \leq 1$, $0 \leq y \leq 1$, $0 \leq x+y \leq 1$).

The first conductive type semiconductor layer 112 may include at least one of GaN, InN, AlN, InGaN, AlGaN, InAlGaN, AlInN, AlGaAs, InGaAs, AlInGaAs, GaP, AlGaP, InGaP, AlInGaP, and InP.

The first conductive type semiconductor layer 112 may be formed as an N-type GaN layer by using a method such as chemical vapor deposition (CVD), molecular beam epitaxy (MBE), sputtering, or hydride vapor phase epitaxy (HVPE). The first conductive type semiconductor layer 112 may be formed by injecting silane (SiH4) gas and n-type impurities such as trimethyl gallium (TMGa) gas, ammonia ($NH_3$) gas, nitrogen ($N_2$) gas, and silicon (Si) into a chamber.

In the active layer 114, electrons injected through the first conductive type semiconductor layer 112 meet holes injected through the second conductive type semiconductor layer 116 to be formed later to emit light having energy determined by the natural energy band of the active layer 114 (light emitting layer).

The active layer 114 may have at least one of a single quantum well structure or a multi quantum well (MQW) structure, a quantum wire structure, and a quantum dot structure. For example, the active layer 114 may have a multi quantum well (MQW) structure that is formed by injecting trimethyl gallium (TMGa) gas, ammonia ($NH_3$) gas, nitrogen ($N_2$) gas, and trimethyl indium (TMIn) gas, but the present disclosure is not limited thereto.

Well layer/barrier layer of the active layer 114 may have a pair structure with at least one of InGaN/GaN, InGaN/InGaN, GaN/AlGaN, InAlGaN/GaN, GaAs(InGaAs)/AlGaAs, and GaP(InGaP)/AlGaP, but the present disclosure is not limited thereto. The well layer may be formed of a material having a lower band gap than that of the barrier layer.

A conductive type clad layer may be formed on at least one of the upper and lower sides of the active layer 114. The conductive type clad layer may be formed of AlGaN based semiconductor, and may have a higher band gap than that of the active layer 114.

The second conductive type semiconductor layer 116 may include group III-V compound semiconductor that is doped with a second conductive type dopant, e.g., include a semiconductor material having a compositional formula of $In_xAl_yGa_{1-x-y}N$ ($0 \leq x \leq 1$, $0 \leq y \leq 1$, $0 \leq x+y \leq 1$). For example, the second conductive type semiconductor layer 116 may include a material selected from the group consisting of GaN, AlN, AlGaN, InGaN, InN, InAlGaN, AlInN, AlGaAs, GaP, GaAs, GaAsP, and AlGaInP. When the second conductive type semiconductor layer 116 is a P type semiconductor layer, the second conductive type dopant may include Mg, Zn, Ca, Sr, or Ba as a P type dopant. The second conductive type semiconductor layer 116 may be formed as a single layer or a multi layer, but the present disclosure is not limited thereto.

The second conductive type semiconductor layer 116 may be formed as a p type GaN layer by injecting trimethyl gallium (TMGa) gas, ammonia (NH$_3$) gas, nitrogen (N$_2$) gas, and trimethyl indium (TMIn) gas, and bis-ethyl-cyclopentadienyl-magnesium (EtCp$_2$Mg){Mg(C$_2$H$_5$C$_5$H$_4$)$_2$} including p type impurities such as magnesium (Mg) into a chamber, but the present disclosure is not limited thereto.

In the embodiment, the first conductive type semiconductor layer 112 may be an N type semiconductor layer, and the second conductive type semiconductor layer 116 may be a P type semiconductor layer, but the present disclosure is not limited thereto. A layer of an opposite conductive type semiconductor to the second conductive type semiconductor, e.g., an N type semiconductor layer (not shown) may be formed on the second conductive type semiconductor layer 116. Accordingly, the light emitting structure 110 may have one of an N-P junction structure, a P-N junction structure, an N-P-N junction structure and a P-N-P junction structure.

The light emitting structure 110 may include a predetermined pattern on the upper surface thereof to improve light extraction efficiency. For example, the predetermined pattern may include a roughness part or photonic crystal structure.

In the embodiment, a second electrode layer 120 may be formed under the light emitting structure 110. The second electrode layer 120 may include an ohmic layer 122, a reflective layer 124, a coupling layer (not shown), and a second substrate 126. The ohmic layer 122 may be a multi layer of a metal, a metal alloy, or a metal oxide to efficiently inject holes. The reflective layer 124 may be a metal layer including Al, Ag, or an alloy including Al or Ag. The coupling layer may be formed of a material such as nickel (Ni) and gold (Au). The second substrate 126 may be formed of a metal, a metal alloy, or a conductive semiconductor material, which has high electric conductivity, to efficiently inject holes.

Thereafter, the buffer layer 141 is formed on the light emitting structure 110.

In the first embodiment, the buffer layer 141 may include an air layer gap. Long-wavelength light excited at the phosphor layer 160 is reflected using the filter layer 150 that may include a plurality of dielectric layers. When the lower end of the filter layer 150 is finished with a dielectric layer, the reflectance may decrease in a region having a specific incident angle.

Thus, the buffer layer 141 or a buffer layer 142 formed of air or a material having a refractive index similar to that of air is disposed under the lowest layer of the filter layer 150 to efficiently reflect long-wavelength light excited at the phosphor layer 160.

In the first embodiment, the buffer layer 141 may include an air gap. To this end, the support layer 130 may be formed. The support layer 130 may be formed of Cu or Au, but the present disclosure is not limited thereto.

Figure 7:
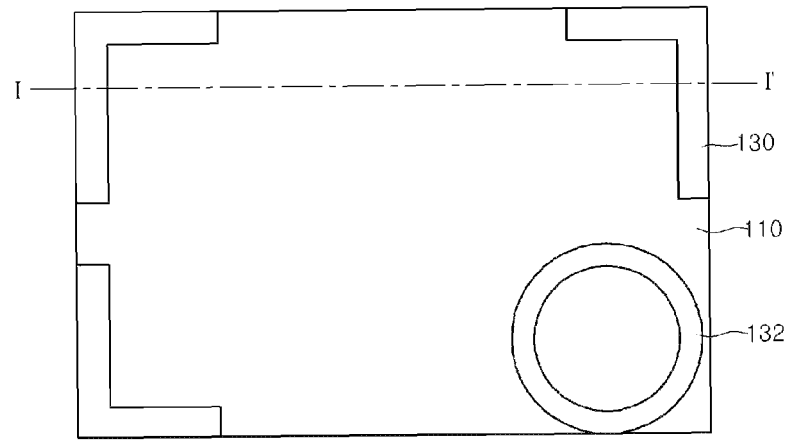

FIG. 7 is a plan view illustrating the light emitting structure 110 of FIG. 6 that is a cross-sectional view taken along line I-I' of FIG. 7.

The support layer 130 may be formed together with a pad open region 132.

Figure 8:
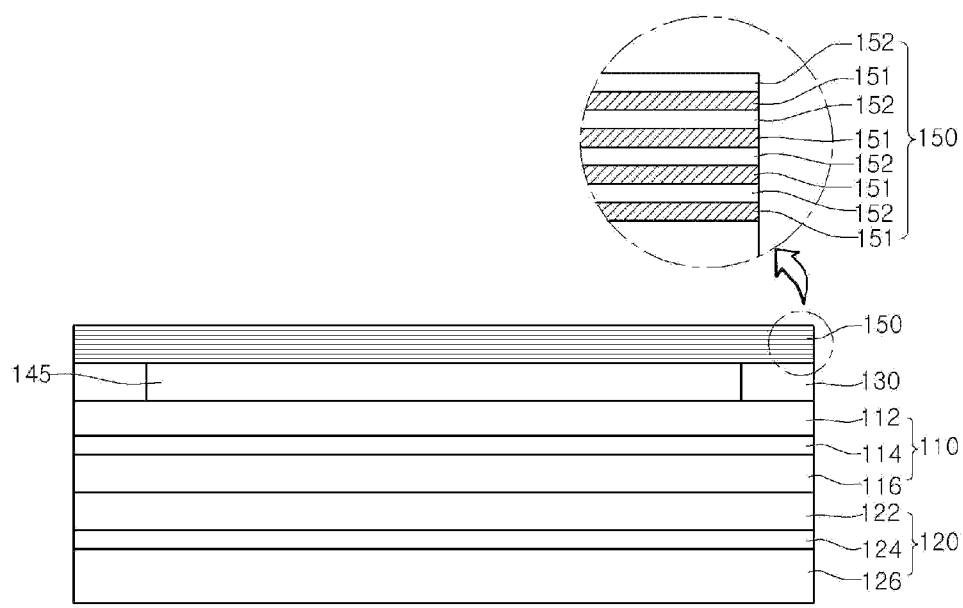

Then, as illustrated in FIG. 8, a sacrificial layer 145 may be formed within the support layer 130. For example, the sacrificial layer 145 may be formed of a photosensitive film material or an insulating material, but the present disclosure is not limited thereto.

Thereafter, the filter layer 150 is formed on the support layer 130 and the sacrificial layer 145. The filter layer 150 may include a plurality of dielectric layers formed by repeatedly stacking dielectric layers having different refractive indexes.

While the filter layer 150 including the dielectric layers is formed, the first dielectric layer 151 having the first refractive index may be formed, and the second dielectric layer 152 having the second refractive index different from the first refractive index may be formed on the first dielectric layer 151.

The first refractive index of the first dielectric layer 151 may be smaller than the second refractive index of the second dielectric layer 152, but the present disclosure is not limited thereto. When the first refractive index of the first dielectric layer 151 may be smaller than the second refractive index of the second dielectric layer 152, the transmittance from the inside of the light emitting device 100 to the outside thereof can be increased, the reflectance of light excited at the outside of the light emitting device 100 can be increased.

The thickness of the first dielectric layer 151 and the thickness of the second dielectric layer 152 may be $\lambda/(4n\times\cos\theta)$ (where, $\lambda$ is a wavelength of light, n is a reflective index of a dielectric layer, and $\theta$ is an incident angle of light to a substrate), but the present disclosure is not limited thereto.

The first dielectric layer 151 and the second dielectric layer 152 may be stacked at a plurality of periods. For example, with respect to a yellow wavelength of about 590 nm converted by a yellow photo sensitive agent, when an SiO$_2$ layer having a refractive index of 1.46 and a TiO$_2$ layer having a refractive index of 2.44 are repeatedly stacked respectively as the first dielectric layer 151 and the second dielectric layer 152 in a quarter-wave stack ($\lambda/4n$), the reflectance of light excited at the outside can be increased according to the number of times of stacking, and the transmittance of light from the inside can be increased, but the present disclosure is not limited to the material of a dielectric layer and the number of times of stacking.

Figure 9:
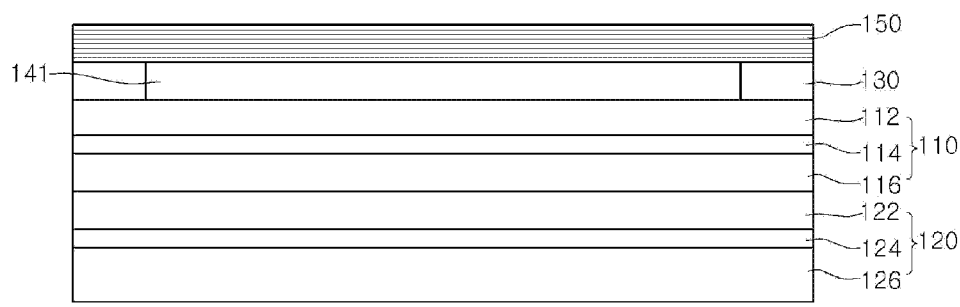

Next, as illustrated in FIG. 9, the sacrificial layer 145 may be removed to form the buffer layer 141. For example, when the sacrificial layer 145 is a photosensitive film layer, an exposure process is performed on the photosensitive film layer in the state illustrated in FIG. 8, the filter layer 150 is formed on the upper surface of the photosensitive film layer, a hole (not shown) is partially formed to expose the photosensitive film layer, and the photosensitive film layer can be removed through the hole. Alternatively, when the sacrificial layer 145 is an insulating layer, the insulating layer may be formed as the sacrificial layer 145 and the filter layer 150 may be formed on the sacrificial layer 145 and the support layer 130 as illustrated in FIG. 8, and then, a hole (not shown) may be formed to partially expose the sacrificial layer 145, and the sacrificial layer 145 may be removed through a process such as wet etching.

Figure 10A:
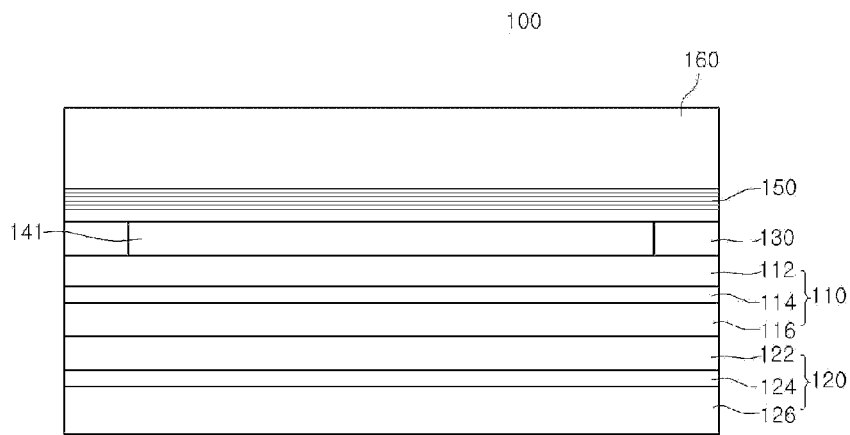

Next, as illustrated in FIG. 10A, the phosphor layer 160 may be formed on the filter layer 150. According to the embodiment, the phosphor layer 160 may be formed on the light emitting structure 110, but the present disclosure is not limited thereto.

The phosphor layer 160 may include a host material and an active material. For example, yttrium aluminum garnet (YAG) as a host material and a cerium (Ce) active material, or a silicate based host material and a europium (Eu) active material may be used, but the present disclosure is not limited thereto.

The light emitting device according to the embodiment includes the selective wavelength filter layer between the light emitting device and the phosphor to transmit high-energy light such as a blue visibly ray or an ultra violet ray and reflect low-energy light excited through the phosphor, thereby obtaining an effective color rendering index.

Figure 10B:
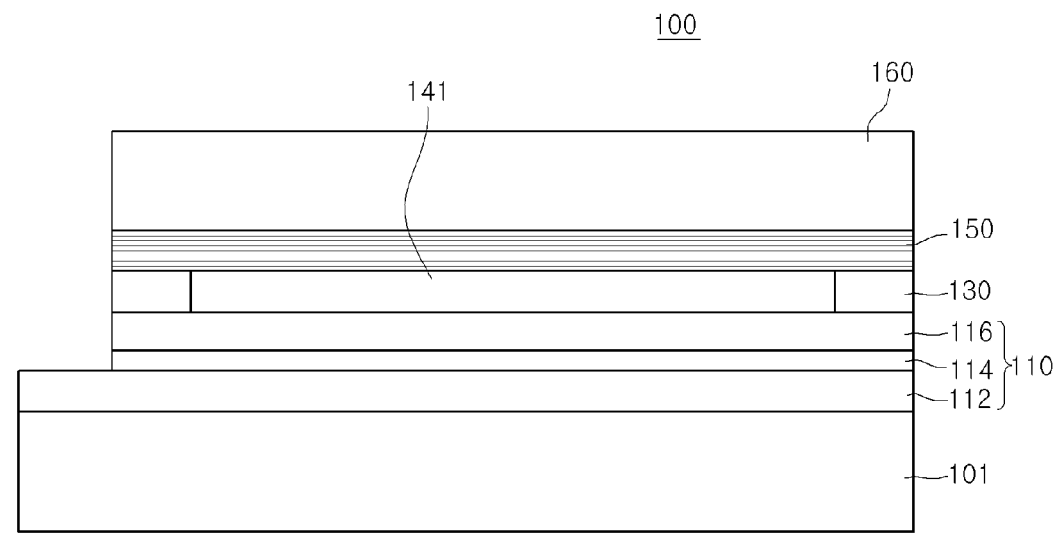
FIG. 10B is a schematic view illustrating another example of the light emitting device according to the first embodiment.

FIG. 10B is a schematic view illustrating another example of the light emitting device 100 according to the first embodiment.

The light emitting device 100 according to an embodiment may be applied to a horizontal light emitting device as well as a vertical light emitting device. For example, the light emitting device 100 may include the light emitting structure 110 disposed on a non-conductive substrate 101, the buffer layer 141 disposed on the light emitting structure 110, and the filter layer 150 disposed on the buffer layer 141. A first electrode (not shown) may be formed on the exposed first conductive semiconductor layer 112 and A second electrode (not shown) may be formed on the second conductive semiconductor layer 116.

Figure 11:
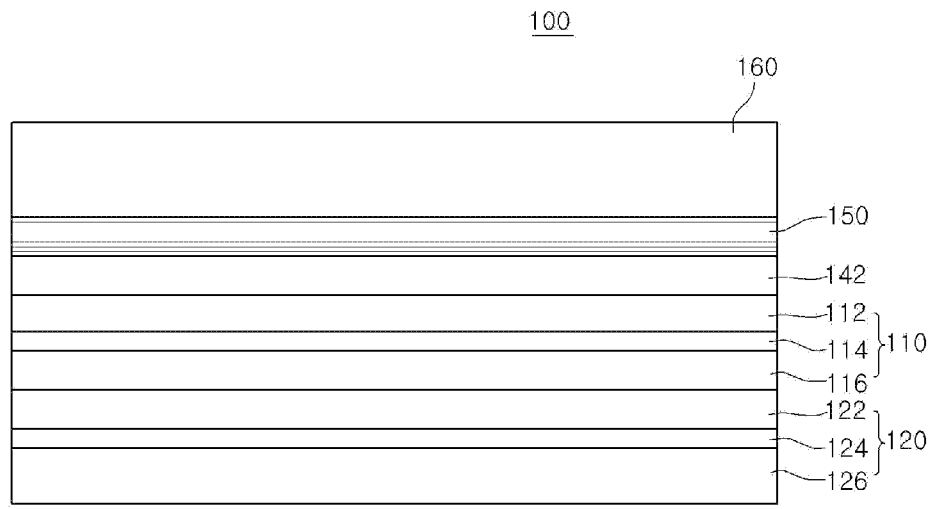
FIG. 11 is a cross-sectional view illustrating a light emitting device according to a second embodiment.

FIG. 11 is a cross-sectional view illustrating a light emitting device according to a second embodiment. The second embodiment may use the technical characteristics of the first embodiment, and different characteristics of the second embodiment from the first one will be described principally.

According to the second embodiment, the buffer layer 142 may include a material having a refractive index between the refractive index of air and the refractive index of the light emitting structure 110. Alternatively, the buffer layer 142 may include a material having a refractive index similar to that of air. For example, the buffer layer 142 may have a refractive index of 1.3 or less, but the present disclosure is not limited thereto.

The buffer layer 142 may include at least one of spin-on-glass and $MgF_2$, but the present disclosure is not limited thereto. According to the second embodiment, a support layer may be omitted.

Figure 12:
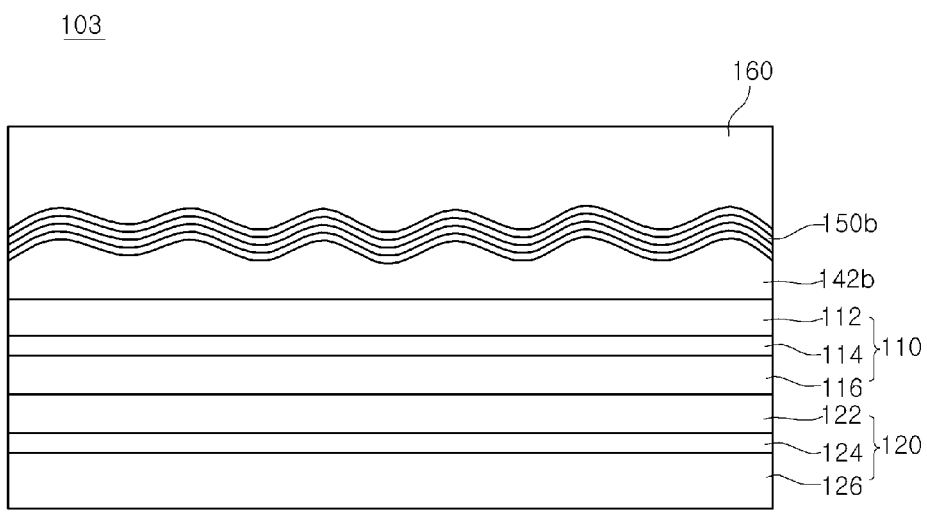
FIG. 12 is a cross-sectional view illustrating a light emitting device according to a third embodiment.

FIG. 12 is a cross-sectional view illustrating a light emitting device 103 according to a third embodiment. The third embodiment may use the technical characteristics of the first and second embodiments.

Since the light emitting device 103 includes a predetermined pattern on a buffer layer 142b, the pattern can be transferred to a filter layer 150b. According to the third embodiment, optical extraction efficiency can be increased using the pattern. The pattern may be a periodic light extraction pattern or a non-periodic light extraction pattern, but the present disclosure is not limited thereto.

Figure 13:
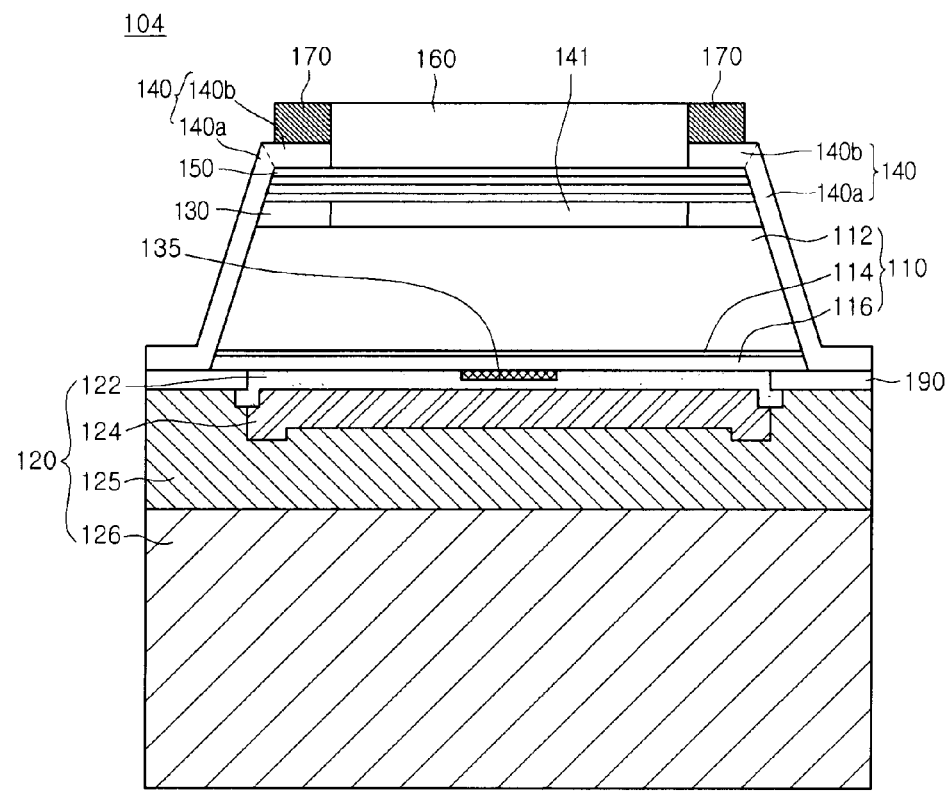
FIG. 13 is a cross-sectional view illustrating a light emitting device according to a fourth embodiment.

FIG. 13 is a cross-sectional view illustrating a light emitting device 104 according to a fourth embodiment. The fourth embodiment may use the technical characteristics of the first to third embodiments.

The light emitting device 104 may include: the light emitting structure 110 including the first conductive type semiconductor layer 112, the active layer 114, and the second conductive type semiconductor layer 116; a first dielectric layer 141 disposed on a portion of the upper surface of the light emitting structure 110, and a pad electrode 170 disposed on the first dielectric layer 141.

A dielectric layer 140 may include a first dielectric layer 140a and a second dielectric layer 140b. The first dielectric layer 140a can be formed on a side surface of the light emitting structure 110, and the second dielectric layer 140 b can be formed on a side surface of the light emitting structure 110, and the first dielectric layer 140a may be connected to the second dielectric layer 140b.

The light emitting device 104 may include a first electrode (not shown) on the light emitting structure 110, and the pad electrode 170 may be electrically connected to the first electrode.

The upper surface of the light emitting structure 110 is provided with a roughness part (not shown) to improve light extraction efficiency.

The second electrode layer 120 may be disposed under the light emitting structure 110, and may include the ohmic layer 122, the reflective layer 124, a coupling layer 125, and the support substrate 126.

A passivation member 190 may be disposed at a lower periphery of the light emitting structure 110, and a current blocking layer (CBL) 135 may be disposed between the light emitting structure 110 and the ohmic layer 122.

The passivation member 190 may be formed in a ring, loop, or tetragonal frame shape along a periphery of the contact between the light emitting structure 110 and the coupling layer 125. A portion of the passivation member 190 may vertically overlap the light emitting structure 110.

The passivation member 190 spaces the coupling layer 125 from the active layer 114 at the periphery to suppress a short circuit between the coupling layer 125 and the active layer 114.

In addition, the passivation member 190 can prevent a short circuit in a chip separation process.

The passivation member 190 may be formed of an electrically insulating material, a material having low electrical conductivity than that of the reflective layer 124 or the coupling layer 125, or a material in schottky contact with the second conductive type semiconductor layer 116. For example, the passivation member 190 may include at least one of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, $TiO_2$, Ti, Al, and Cr.

Figure 14:
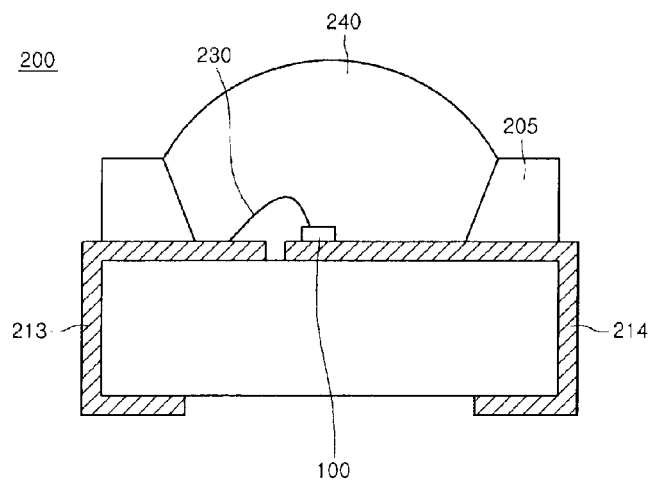
FIG. 14 is a cross-sectional view illustrating a light emitting device package according to an embodiment.

FIG. 14 is a cross-sectional view illustrating a light emitting device package provided with a light emitting device according to an embodiment.

Referring to FIG. 14, a light emitting device package 200 according to the current embodiment includes a package body 205, a third electrode layer 213 and a fourth electrode layer 214 disposed in the package body 205, a light emitting device 100 disposed in the package body 205 and electrically connected to the third electrode layer 213 and the fourth electrode layer 214, and a molding member 240 surrounding the light emitting device 100.

The package body 205 may be formed of a silicon material, a synthetic resin material, or a metal material. An inclined surface may be disposed around the light emitting device 100.

The third electrode layer 213 and the fourth electrode layer 214 are electrically separated from each other and supply a power to the light emitting device 100. Also, the third electrode layer 213 and the fourth electrode layer 214 may reflect light generated in the light emitting device 100 to improve light efficiency, and may release heat generated in the light emitting device 100 to the outside.

The light emitting device 100 may be the vertical type light emitting device exemplified in FIGS. 1, 11, 12 or 13, but the present disclosure is not limited thereto.

The light emitting device 100 may be disposed on the package body 205 or on the third electrode layer 213 or the fourth electrode layer 214.

The light emitting device 100 may be electrically connected to the third electrode layer 213 and/or the fourth electrode layer 214 through one of a wire method, a flip chip method, and a die bonding method. In the embodiment, the light emitting device 100 is electrically connected to the third electrode layer 213 through the wire 230, and directly contacts the fourth electrode layer 214.

The molding member 240 may surround the light emitting device 100 to protect the light emitting device 100.

The light emitting device package according to the embodiment may be provided in plurality on a board, and a light guide panel, a prism sheet, a spread sheet, and a fluorescent sheet may be disposed as an optical member in the path of light emitted from the light emitting device package. The light emitting device package, the board, and the optical member may function as a backlight unit or a lighting unit. For example, a lighting system may include a lighting unit, a backlight unit, an indicating device, a lamp, and a street lamp.

Figure 15:
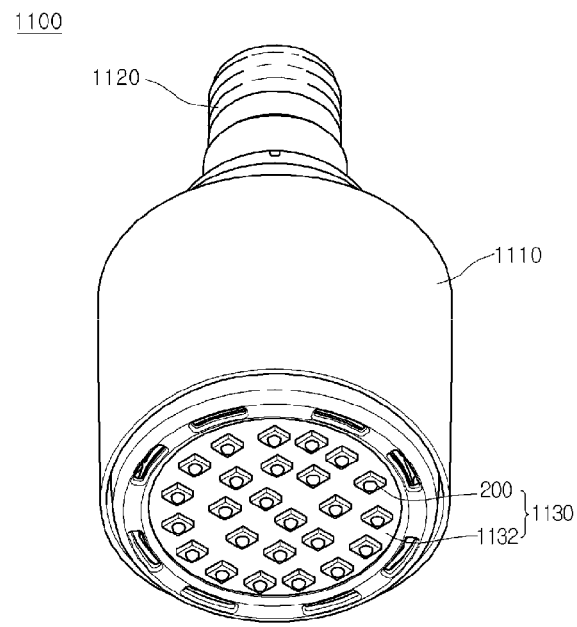
FIG. 15 is a perspective view illustrating a lighting unit according to an embodiment.

FIG. 15 is a perspective view of a lighting unit 1100 according to an embodiment. However, the lighting unit 1100 is just an example of a lighting system, and thus, the present disclosure is not limited thereto.

Referring to FIG. 15, the lighting unit 1100 may include a case body 1110, a light emitting module 1130 disposed in the case body 1110, and a connection terminal 1120 disposed in the case body 1110 to receive a power from an external power source.

The case body 1110 may be formed of a material having an improved heat dissipation characteristic. For example, the case body 1110 may be formed of a metal material or resin material.

The light emitting module 1130 may include a board 1132 and at least one light emitting device package 200 mounted on the board 1132.

A circuit pattern may be printed on an insulation material to form the board 1132. For example, the board 1132 may include a printed circuit board (PCB), a metal core PCB, a flexible PCB, or a ceramic PCB.

Also, the board 1132 may be formed of a material that can effectively reflect light. A surface of the board 1132 may be coated with a colored material, e.g., a white or silver-colored material by which light is effectively reflected.

The light emitting device package 200 may be mounted on the board 1132. The light emitting device package 200 may include at least one light emitting device 100. The light emitting device 100 may include a colored light emitting diode that emits red, green, blue, or white light, and an UV light emitting diode that emits ultraviolet (UV) light.

The light emitting module 1130 may include a plurality of light emitting device packages 200 to obtain various colors and brightness. For example, a white light emitting device, a red light emitting device, and a green light emitting device may be disposed in combination with each other to secure a high color rendering index (CRI).

The connection terminal 1120 may be electrically connected to the light emitting module 1130 to supply a power. Although the connection terminal 1120 is screw-inserted into an external power source in a socket manner as illustrated in FIG. 15, the present disclosure is not limited thereto. For example, the connection terminal 1120 may have a pin shape. Thus, the connection terminal 1120 may be inserted into the external power source or connected to the external power source using an interconnection.

Figure 16:
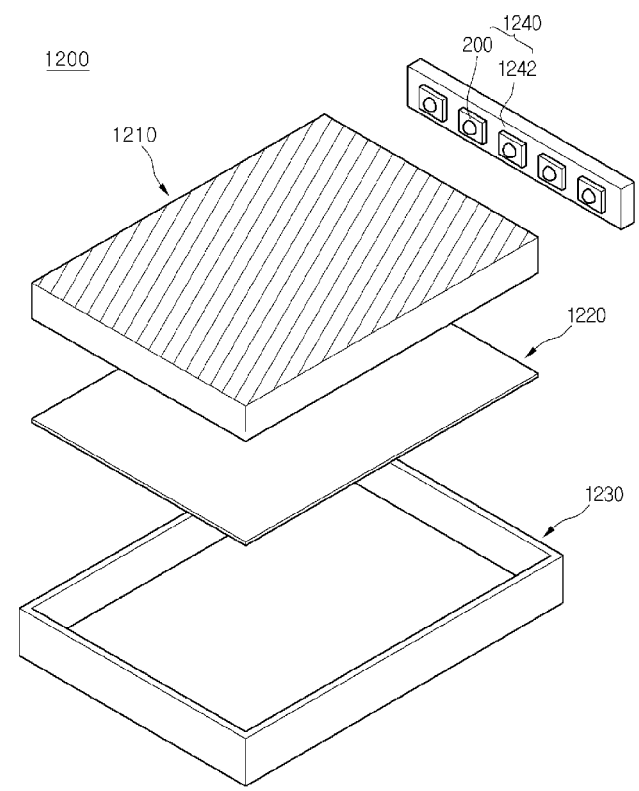
FIG. 16 is an exploded perspective view illustrating a backlight unit according to an embodiment.

FIG. 16 is an exploded perspective view of a backlight unit 1200 according to an embodiment. However, the backlight unit 1200 is just an example of a lighting system, and thus, the present disclosure is not limited thereto.

A backlight unit 1200 according to an embodiment may include a light guide plate 1210, a light emitting module 1240, a reflective member 1220, and a bottom cover 1230, but is not limited thereto. The light emitting module 1240 may provide light to the light guide plate 1210. The reflective member 1220 may be disposed below the light guide plate 1210. The bottom cover 1230 may receive the light guide plate 1210, the light emitting module 1240, and the reflective member 1220.

The light guide plate 1210 diffuses light to produce planar light. The light guide plate 1210 may be formed of a transparent material. For example, the light guide plate 1210 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1240 provides light to at least one surface of the light guide plate 1210. Thus, the light emitting module 1240 may be used as a light source of a display device including the backlight unit.

The light emitting module 1240 may contact the light guide plate 1210, but is not limited thereto. In particular, the light emitting module 1240 may include a board 1242 and a plurality of light emitting device packages 200 mounted on the board 1242. The board 1242 may contact the light guide plate 1210, but is not limited thereto.

The board 1242 may be a PCB including a circuit pattern (not shown). However, the board 1242 may include a metal core PCB or a flexible PCB as well as the PCB, but is not limited thereto.

The light emitting device packages 200 may have light emitting surfaces that emit light on the board 1242 and are spaced a predetermined distance from the light guide plate 1210.

The reflective member 1220 may be disposed below the light guide plate 1210. The reflective member 1220 reflects light incident onto a bottom surface of the light guide plate 1210 to proceed in an upward direction, thereby improving brightness of the backlight unit. For example, the reflective member may be formed of one of PET, PC, and PVC, but is not limited thereto.

The bottom cover 1230 may receive the light guide plate 1210, the light emitting module 1240, and the reflective member 1220. For this, the bottom cover 1230 may have a box shape with an open upper side, but is not limited thereto.

The bottom cover 1230 may be formed of a metal material or a resin material. Also, the bottom cover 1230 may be manufactured using a press forming process or an extrusion molding process.

The light emitting device, the light emitting device package, and the lighting system according to the embodiments include a selective wavelength filter layer between the light emitting device and the phosphor to transmit high-energy light such as a blue visibly ray or an ultra violet ray and reflect low-energy light excited through the phosphor, thereby obtaining an effective color rendering index.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a light emitting structure including a first conductive type semiconductor layer,
   a second conductive type semiconductor layer, and an active layer between the first conductive type semiconductor layer and the second conductive type semiconductor layer;
   a support layer on the light emitting structure;
   a filter layer on the support layer; and
   an air gap inter-disposed between the light emitting structure and the filter layer,
   wherein the filter layer comprises:
      a first dielectric layer having a first refractive index; and
      a second dielectric layer on the first dielectric layer, the second dielectric layer having a second refractive index different from the first refractive index,
   wherein an outer side surface of the support layer is vertically aligned with an outer side surface of the filter layer;
   wherein a lateral width of the air gap is greater than a lateral width of the support layer, and
   wherein all top surfaces of the support layer directly contact a bottom surface of the filter layer.

2. The light emitting device according to claim 1, wherein the support layer comprises one of copper (Cu) and gold (Au).

3. The light emitting device according to claim 1, wherein a thickness of the first dielectric layer and a thickness of the second dielectric layer are both $\lambda/(4n \times \cos\theta)$, where $\lambda$ is a wavelength of long-wavelength light to be reflected, n is a refractive index of the first or the second dielectric layer, respectively, and $\theta$ is an angle of incident light.

4. The light emitting device according to claim 1, further comprising a phosphor layer on the filter layer.

5. The light emitting device according to claim 1, further comprising:
   at least one electrode on the light emitting structure; and
   a conductive or non-conductive substrate under the light emitting structure.

6. The light emitting device according to claim 1, wherein the air gap is flush with the support layer.

7. The light emitting device according to claim 1, wherein the support layer is only between a periphery of the filter layer and a periphery of the light emitting structure.

8. The light emitting device according to claim 1, wherein a maximum lateral width of the air gap is greater than a maximum lateral width of the support layer.

9. A light emitting device comprising:
   a light emitting structure including a first conductive type semiconductor layer, a second conductive type semiconductor layer, and an active layer between the first conductive type semiconductor layer and the second conductive type semiconductor layer;
   a support layer on the light emitting structure;
   a filter layer on the support layer, and
   an air gap inter-disposed between the light emitting structure and the filter layer,
   wherein a topmost surface of the support layer is flush with a bottom most surface of the filter layer,
   wherein a lateral width of the air gap is greater than a lateral width of the support layer, and
   wherein all top surfaces of the support layer directly contact a bottom surface of the filter layer.

10. The light emitting device according to claim 9, further comprising a phosphor layer on the filter layer.

11. The light emitting device according to claim 10, wherein the phosphor layer comprises a substantially flat top surface.

12. The light emitting device according to claim 9, further comprising:
   at least one electrode on the light emitting structure; and
   a conductive or non-conductive substrate under the light emitting structure.

13. The light emitting device according to claim 9, wherein the air gap is flush with the support layer.

14. The light emitting device according to claim 9, wherein the support layer is only between a periphery of the filter layer and a periphery of the light emitting structure.

15. The light emitting device according to claim 9, wherein a maximum lateral width of the air gap is greater than a maximum lateral width of the support layer.

16. A light emitting device package comprising:
   a package body;
   at least one electrode layer on the package body; and
   a light emitting device electrically connected to the electrode layer,
   wherein the light emitting device comprises:
      a light emitting structure including a first conductive type semiconductor layer,
      a second conductive type semiconductor layer, and an active layer between the first conductive type semiconductor layer and the second conductive type semiconductor layer;
      a support layer on the light emitting structure; a filter layer on the support layer; and
      an air gap inter-disposed between the light emitting structure and the filter layer,
      wherein the filter layer comprises:
         a first dielectric layer having a first refractive index; and
         a second dielectric layer on the first dielectric layer, the second dielectric layer having a second refractive index different from the first refractive index,
      wherein an outer side surface of the support layer is vertically aligned with an outer side surface of the filter layer;
      wherein a lateral width of the air gap is greater than a lateral width of the support layer, and
      wherein all to surfaces of the support layer directly contact a bottom surface of the filter.

* * * * *